US012639506B1

(12) United States Patent
    Mashiah

(10) Patent No.: US 12,639,506 B1
(45) Date of Patent: May 26, 2026

(54) VIA LADDER CHECK

(71) Applicant: Amazon Technologies, Inc., Seattle, WA (US)

(72) Inventor: Adi Mashiah, Ganne Tiqwa (IL)

(73) Assignee: Amazon Technologies, Inc., Seattle, WA (US)

( * ) Notice: Subject to any disclaimer, the term of this patent is extended or adjusted under 35 U.S.C. 154(b) by 731 days.

(21) Appl. No.: 18/067,396

(22) Filed: Dec. 16, 2022

(51) Int. Cl.
    *G06F 30/398*     (2020.01)
    *G06F 30/392*     (2020.01)
(52) U.S. Cl.
    CPC .......... *G06F 30/398* (2020.01); *G06F 30/392* (2020.01)
(58) Field of Classification Search
    CPC .............................. G06F 30/398; G06F 30/392
    USPC ........................................................ 716/111
    See application file for complete search history.

(56) References Cited

U.S. PATENT DOCUMENTS

| | | | | |
|---|---|---|---|---|
| 12,032,890 | B2 * | 7/2024 | Babokhov | .............. G06F 30/398 |
| 2020/0004917 | A1 * | 1/2020 | Ku | .......... G06F 30/394 |
| 2020/0311332 | A1 * | 10/2020 | Kumar | ................. G06F 30/394 |
| 2023/0243888 | A1 * | 8/2023 | Peng | ............. G01R 31/318525 |
| | | | | 257/48 |
| 2024/0222360 | A1 * | 7/2024 | Wei | ......................... H10D 88/00 |

* cited by examiner

*Primary Examiner* — Suchin Parihar
(74) *Attorney, Agent, or Firm* — Weaver Austin Villeneuve & Sampson LLP

(57)                ABSTRACT

Techniques to verify the connectivity between standard cell pins and via ladder structures can include obtaining a mapping of standard cell pins to respective via ladders' characteristics, and determining a sufficient number of connections for connecting a standard cell pin to a corresponding via ladder in an integrated circuit design based on the via ladder characteristics of the standard cell pin. A data structure that models the integrated circuit design as a resistance-capacitance network is used to verify that the standard cell pin has the sufficient number of connections to the corresponding via ladder.

20 Claims, 8 Drawing Sheets

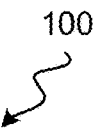
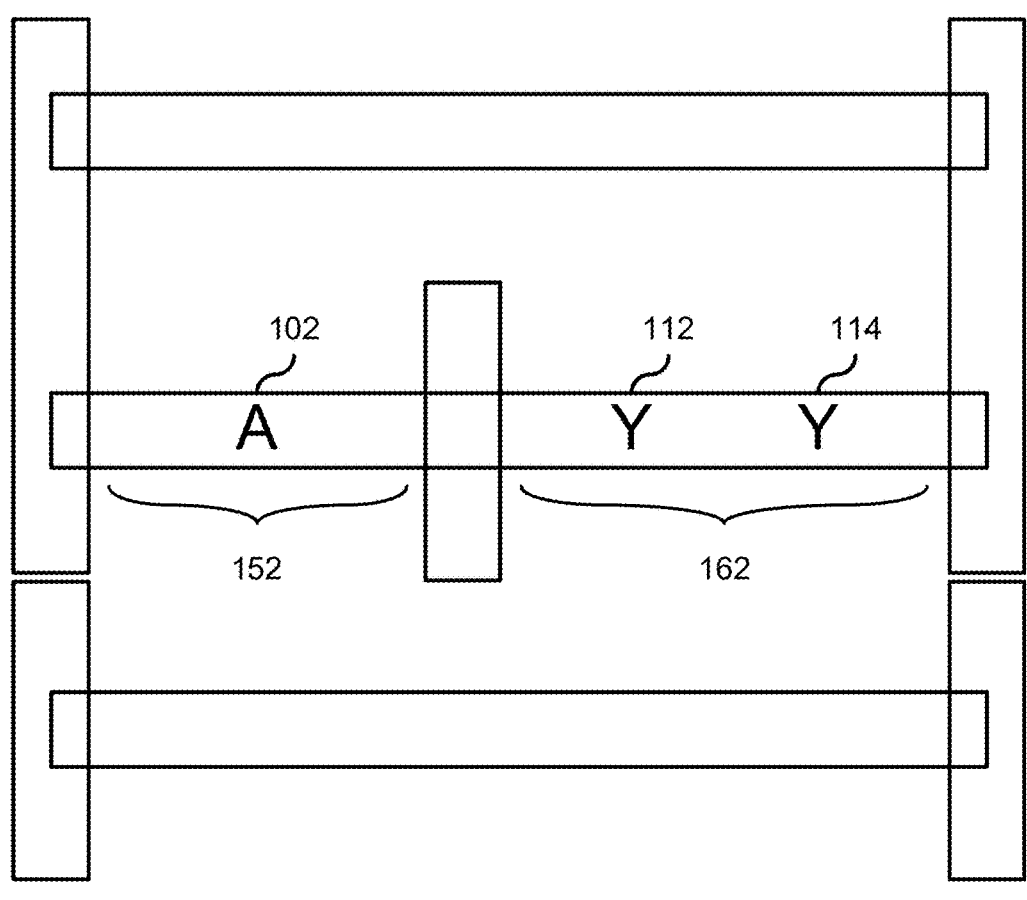
FIG. 1

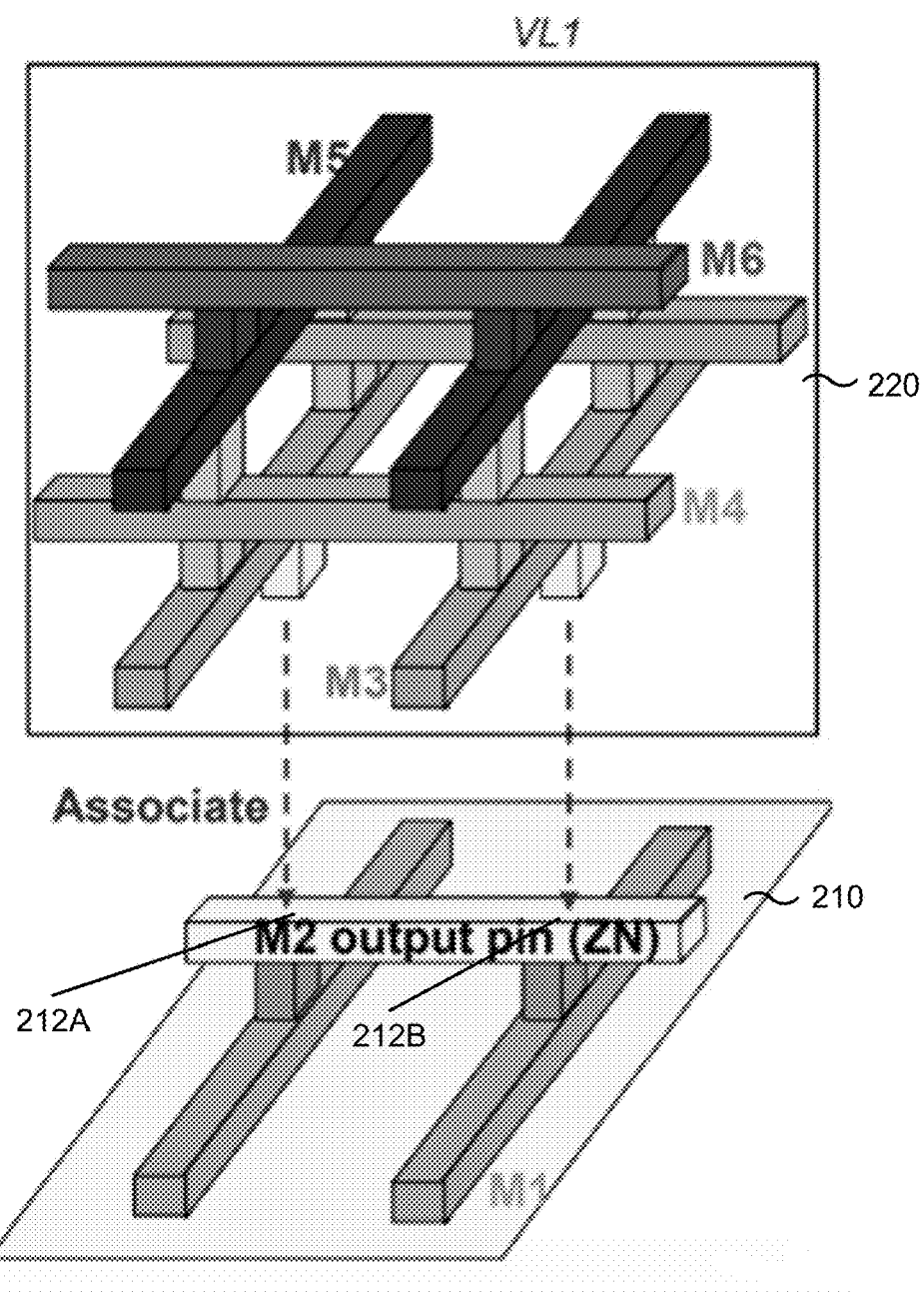
FIG. 2

600

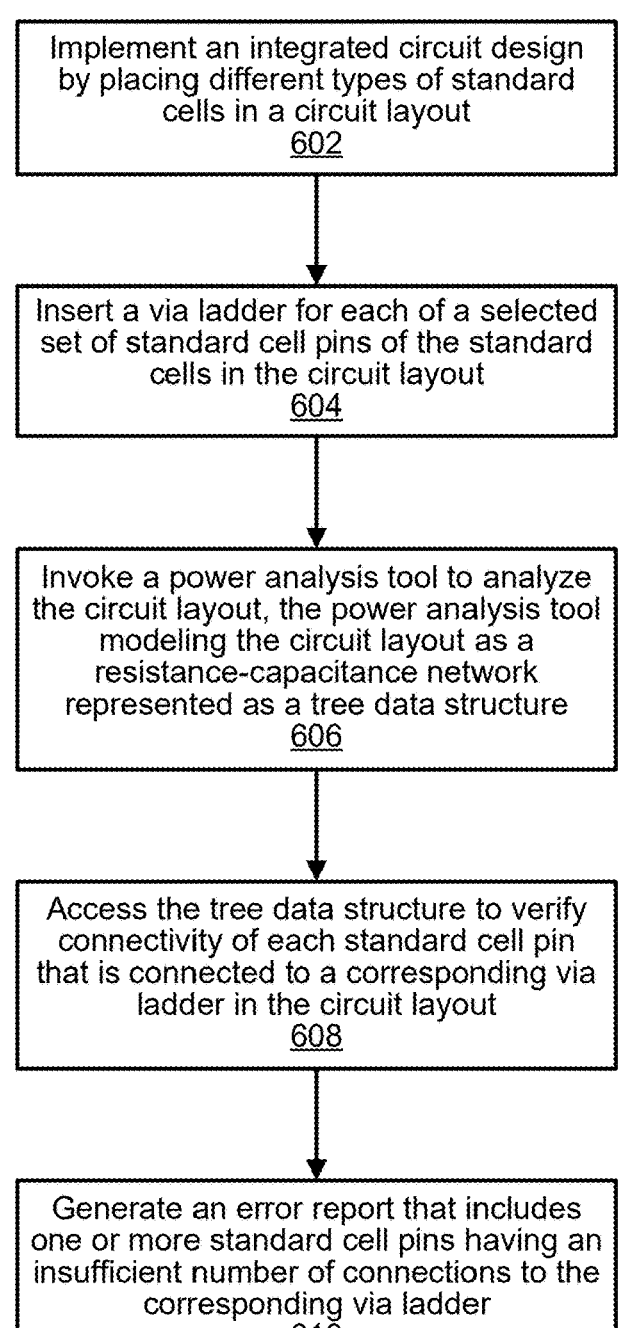

Implement an integrated circuit design by placing different types of standard cells in a circuit layout
602

Insert a via ladder for each of a selected set of standard cell pins of the standard cells in the circuit layout
604

Invoke a power analysis tool to analyze the circuit layout, the power analysis tool modeling the circuit layout as a resistance-capacitance network represented as a tree data structure
606

Access the tree data structure to verify connectivity of each standard cell pin that is connected to a corresponding via ladder in the circuit layout
608

Generate an error report that includes one or more standard cell pins having an insufficient number of connections to the corresponding via ladder
610

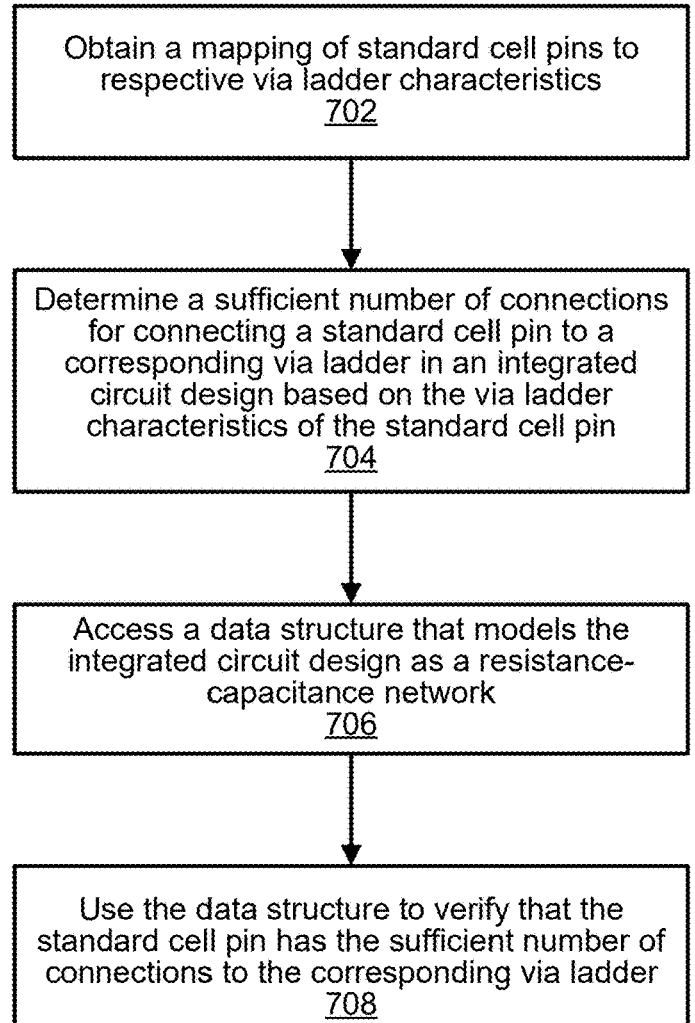

Obtain a mapping of standard cell pins to respective via ladder characteristics
702

Determine a sufficient number of connections for connecting a standard cell pin to a corresponding via ladder in an integrated circuit design based on the via ladder characteristics of the standard cell pin
704

Access a data structure that models the integrated circuit design as a resistance-capacitance network
706

Use the data structure to verify that the standard cell pin has the sufficient number of connections to the corresponding via ladder
708

FIG. 7

VIA LADDER CHECK

BACKGROUND

As transistor sizes become smaller, integrated circuit devices are incorporating greater and greater amount of computing power and functionality into a single chip. At the same time, such integrated circuit devices are also being driven at faster and faster clock frequencies. The combination of dense integration and faster clock frequencies has vastly reduced the timing margins of integrated circuit devices. With shrinking feature sizes, resistance in the base and lower layers where active circuitry resides is becoming a dominant factor in circuit delays. The shrinking geometries also increase the risk of failures due to electromigration.

BRIEF DESCRIPTION OF THE DRAWINGS

Various embodiments in accordance with the present disclosure will be described with reference to the drawings, in which:

FIG. 1 illustrates an example of an integrated circuit layout of a standard cell, according to certain aspects of the disclosure;

FIG. 2 illustrates an example of a multilayer structure in an integrated circuit layout, according to certain aspects of the disclosure;

FIG. 6 illustrates a flow diagram of an example of a process for implementing an integrated circuit design, according to certain aspects of the disclosure;

FIG. 7 illustrates a flow diagram of an example of a process for performing a via ladder check, according to certain aspects of the disclosure.

DETAILED DESCRIPTION

Figure 3:
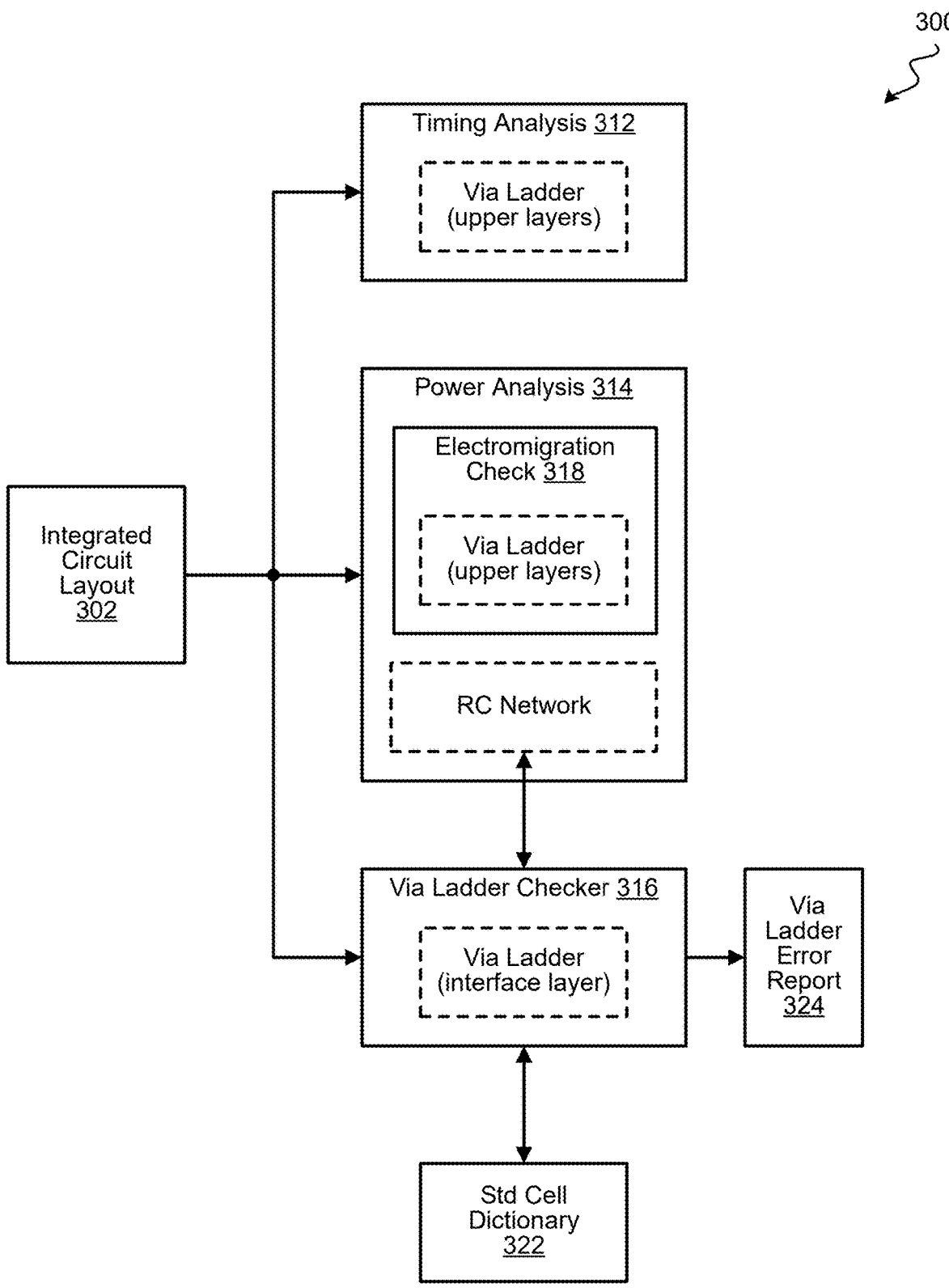
FIG. 3 illustrates a conceptual diagram of an example of an integrated circuit design verification technique, according to certain aspects of the disclosure.

To reduce the impact of resistance and electromigration of an integrated circuit device, via ladders can be used to connect logic gates from lower layers to the upper metal layers where interconnect routing can be implemented with lower resistance. A via ladder may include a parallel mesh of wires and vias spanning multiple metal layers to form a lattice structure. The number of vias and number of wires at each layer can vary from layer to layer. A via ladder provides multiples routes for current to reach the upper layers to reduce path delays. The distributed current delivery can also mitigate against electromigration effects. Implementing via ladders comes at the cost of increased routing resources, because a via ladder uses more vias and wires than a typical net connection. Thus, via ladders can be selectively used in timing critical paths of an integrated circuit design, while other portions of the design can use traditional net connections.

To support implementation of via ladders, technology node providers can include logic gates with pins having multiple connection points in the standard cell library. A via ladder can then be inserted into the integrated circuit design by connecting the via ladder to the logic gate at the multiple connection points. In some instances, the via ladder can be inserted incorrectly (e.g., wrong type of via ladder for the pin), or post-insertion modifications made to the layout to fix other issues can impact the via ladder (e.g., removal of part of the via ladder structure). As such, a via ladder design check can be performed to verify that the via ladders in an integrated circuit design conform to the intended structure.

However, not all via ladder deviations from the intended structure require correction. For example, when a portion of the via ladder structure is removed to provide sufficient spacing for other structures, if the signal path is still able to meet the timing requirements of the circuit and have sufficient electromigration tolerance, then the degradation caused by the erasure of that portion of the via ladder is still acceptable and the deviation from the intended via ladder structure need not be corrected in the final design. Although timing analysis and electromigration modeling tools can properly model the upper layers of via ladders to determine whether a structure is able to meet the requirements of a design, such tools can have difficulty modeling the interface between the standard cell and the via ladder correctly. This is due to the standard cell being provided as a black box by the technology node provider, and there can be insufficient information to model the standard cell pin behavior correctly under different connectivity scenarios.

The techniques disclosed herein provide a via ladder check technique to verify that an integrated circuit design has a sufficient number of connections at the interface layer between a via ladder and a standard cell pin. Unlike checkers that may report all mismatches between an intended via ladder structure and the actual circuit design layout, the via ladder verification technique disclosed herein can be used to target the design checks at the interface layer. The other layers of the via ladder can rely on timing analysis and electromigration modeling tools to determine if the circuit design layout meets the design requirements. This can significantly reduce the number of false-positive errors being reported that do not need to be fixed, while focusing on errors that may have a meaningful impact on the performance of the design.

In some implementations, a mapping table or a dictionary can be referenced to determine the requisite number of connections between a standard cell pin and a compatible via ladder. The layout of the integrated circuit design can be modeled as a resistance-capacitance network using a data structure representing nodes connected by edges (e.g., a graph-based tree data structure), and the data structure can be traversed (e.g., using a breadth-first search) to determine if the standard cell pin has at least the requisite number of connections to the interface layer of the via ladder. In some implementations, a power analysis tool can be invoked to facilitate generation of the data structure. Verification of the integrated circuit design can also be partitioned (e.g., using map reduce techniques) for parallel processing to improve runtime efficiency when checking the via ladders in the entire integrated circuit design.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an example of a plane view of a layout of a standard cell 100. In the particular example shown, standard cell 100 is a buffer circuit having an input "A" and an output "Y." A technology node provider (e.g., a semiconductor manufacturer such as a foundry, an intellectual property (IP) block provider, etc.) may provide the layout to a chip designer. The standard cell layout can be in a graphic system design (GDS) file format. The layout may represent the standard cell as a set of geometric shapes on various metal and semiconductor layers. As shown in FIG. 1, the buffer standard cell 100 has an input pin 152 and an output pin 162. The input pin 152 can have a single "A" label indicating a connection point 102 for the input signal. The output pin 162 can have multiple "Y" labels indicating respective connection points 112 and 114 for the output signal. Standard cell 100 can have a pin (e.g., output pin 162) with multiple connection points to provide connectivity to a via ladder structure. This can, for example, allow the driver of the buffer circuit to supply output current along multiple paths to the upper layers of the integrated circuit design. In some implementations, output pin 162 can be composed of multiple geometric shapes, with multiple connection points for each shape.

FIG. 2 illustrates an example of a portion of a multilayer structure of an integrated circuit device 200. Integrated circuit device 200 can include a logic gate 210 implemented on the lower layers of the multilayer structure, and a via ladder 220 implemented on upper layers of the multilayer structure. For example, logic gate 210 can be a standard cell implemented on a M1 metal layer and a M2 metal layer. The output pin (ZN) of the logic gate 210 can be implemented on the M2 metal layer. The output pin (ZN) may include two connection points 212A and 212B.

Via ladder 220 can be implemented on the VIA23 (via layer between M2 and M3) through M6 metal layers. In the example shown, via ladder 220 has two VIA23 vias for connecting the output pin on the M2 metal layer to two parallel wires on the M3 metal layer. In this example, the M3 metal layer can be referred to as an interface layer, because the M3 metal layer is the first metal layer that connects to the standard cell pin. In other via ladder structures, the interface layer can be on a different metal layer, depending on which layer that the standard cell pin resides on.

From the M3 metal layer, four vias are used to connect to two parallel wires on the M4 metal layer. From the M4 metal layer, four vias are used to connect to two parallel wires on the M5 metal layer. From the M5 metal layer, two vias are used to connect to an interconnect wire on the M6 metal layer. The wirings on each layer of the via ladder 220 are orthogonal to the adjacent layers to form a lattice structure over multiple metal layers. The interconnect coupling the output of logic gate 210 to another logic gate can be routed on the M6 metal layer.

During the backend design phase of integrated circuit device 200, an electronic design automation (EDA) tool (e.g., a place-and-route tool) can place standard cells such as logic gate 210 onto a floorplan of the integrated circuit device. A via ladder insertion algorithm can then insert via ladders such as via ladder 220 into the integrated circuit design. For each standard cell pin in the design that provides connectivity to a via ladder, the via ladder insertion algorithm can look up a set of compatible via ladders for the standard cell pin, and select a compatible via ladder to insert into the position above the standard cell pin. The compatible via ladders for a given standard cell pin can vary in the number of metal layers, the number of vias or pillars connecting adjacent layers, and the number of wires in each layer. The via ladder insertion algorithm can select the via ladder based on the available space for placement of the via ladder, the interconnect routing layer that the via ladder has to reach, timing requirements of the signal, and/or other design considerations. Subsequent to the insertion of via ladders and routing of the interconnect layers, a design verification is performed on the overall integrated circuit design layout to verify that the layout meets the design specifications. This may include physical verification (e.g., design rule check (DRC), layout versus schematic (LVS) check, electric rule check (ERC), etc.), as well as timing and power verification based on the physical layout.

In some instances, because of violations found by the design verification, the layout of the integrated circuit design can be modified to address the violations. Such modifications can affect the structure of via ladder 220. For example, shifting a structure to address a design rule violation associated with some other component may require a portion of via ladder 220 to be removed or be re-positioned, which can cause the resulting via ladder 220 to deviate from its original structure. In some instances, a software bug in the via ladder insertion algorithm can also result in an incompatible via ladder to be inserted or inserted in the wrong position, causing the layout to deviate from the intended structure. However, as indicated above, so long as the resulting structure can meet timing and electromigration tolerances, as well as other design requirements, such deviations from the intended structure need not be fixed, and reporting such deviations of the via ladder can lead to unnecessary review and debug of violations that do not require correction.

FIG. 3 illustrates a conceptual diagram 300 of a via ladder check technique. The via ladder check workflow begins with a post-insertion integrated circuit layout 302 containing via ladders inserted into the design. The integrated circuit layout 302 is subjected to a timing analysis verification 312 to determine if the physical design contains any timing violations, as well as a power analysis verification 314 to determine if the physical design meets the IR drop requirements of the design. Power analysis verification 314 may also include electromigration check 318 to verify the electromigration tolerance of the design. As part of the power analysis verification 314, the integrated circuit layout 302 can be modeled as a resistance-capacitance (RC) network. For example, a power analysis tool may model the wires and vias of integrated circuit layout 302 as resistances, and model connection points such as vias' locations and pins' locations as capacitances. In some implementations, the RC network can be represented as nodes connected by edges in a data structure (e.g., a graph-based tree data structure) in which each node represents a capacitance and each edge represents a wire resistance or via resistance. It should be noted that the tree data structure representing the RC network can have more than one root node.

A via ladder checker 316 may access a standard cell dictionary 322 (e.g., a mapping table) to determine the requisite number of connections for each standard cell pin that is connected to a via ladder. The standard cell dictionary 322 may contain a listing of names of standard cells and their pins that can connect with via ladders. Each standard cell pin can be mapped to via ladder characteristics suitable for the particular standard cell pin. For example, the via ladder characteristics can include a listing of via ladder structures compatible with the standard cell pin, and each via ladder structure can be associated with layer information and connection information for each layer of the via ladder structure. Via ladder checker 316 can obtain the requisite number of connections between a standard cell pin and the interface layer of the via ladder by looking up the standard cell pin in the standard cell dictionary 322. Different standard cell pins can differ in the requisite number of connections for various reasons such as the layer of the pin, function of the standard cell, drive strength, etc.

Via ladder checker 316 can access the RC network data structure generated by the power analysis verification 314 to determine whether the standard cell pins of the integrated circuit layout 302 which are connected to respective via ladders have a sufficient number of connections. In the integrated circuit design, not all standard cell pins have to be connected to via ladders. Hence, via ladder checker 316 can check only the standard cell pins listed in standard cell dictionary 322, or only the standard cell pins indicated as supporting a via ladder connection. Via ladder checker 316 can query the RC network data structure for instances of the standard cell pin to identify the standard cell pins of interest. For each of the identified pin, via ladder checker 316 can traverse the RC network data structure to determine the number of connections between the standard cell pin and the interface layer of the via ladder in the integrated circuit layout 302, and compare that number with the requisite number of connections obtained from the standard cell dictionary 322. For any standard cell pins that lack the requisite number of connections to the interface layer of the corresponding via ladder, the standard cell pin can be recorded in the via ladder error report 324. A chip designer can review the via ladder error report 324, and fix the violations that require correction before signing off the physical design for manufacture.

As indicated in FIG. 3, via ladder checker 316 verifies the connectivity of the interface layer of the via ladders. In some implementations, the upper layers of the via ladders are not checked or verified by via ladder checker 316. Instead, the upper layers of the via ladders can rely on other verification tools to check for errors. Hence, in some implementations, the via ladder error report 324 may contain only connectivity errors or violations (e.g., insufficient number of connections) at the interface layer of the via ladders. Connectivity errors in the upper layers of the via ladders are less of a concern, because other verification tools such as electromigration check 318 and/or timing analysis verification 312 can correctly model the structures in the upper layers of the via ladder. Thus, deviations of the structure in the upper layers of the via ladder causing an electromigration or timing violation will be caught by electromigration check 318 or timing analysis verification 312. Segregating the upper layers from via ladder checker 316 can also result in fewer reported false-positive errors that do not requiring correction, because deviations of the structure in the upper layers of the via ladder that do not result in a meaningful degradation will not be flagged.

Figure 4:
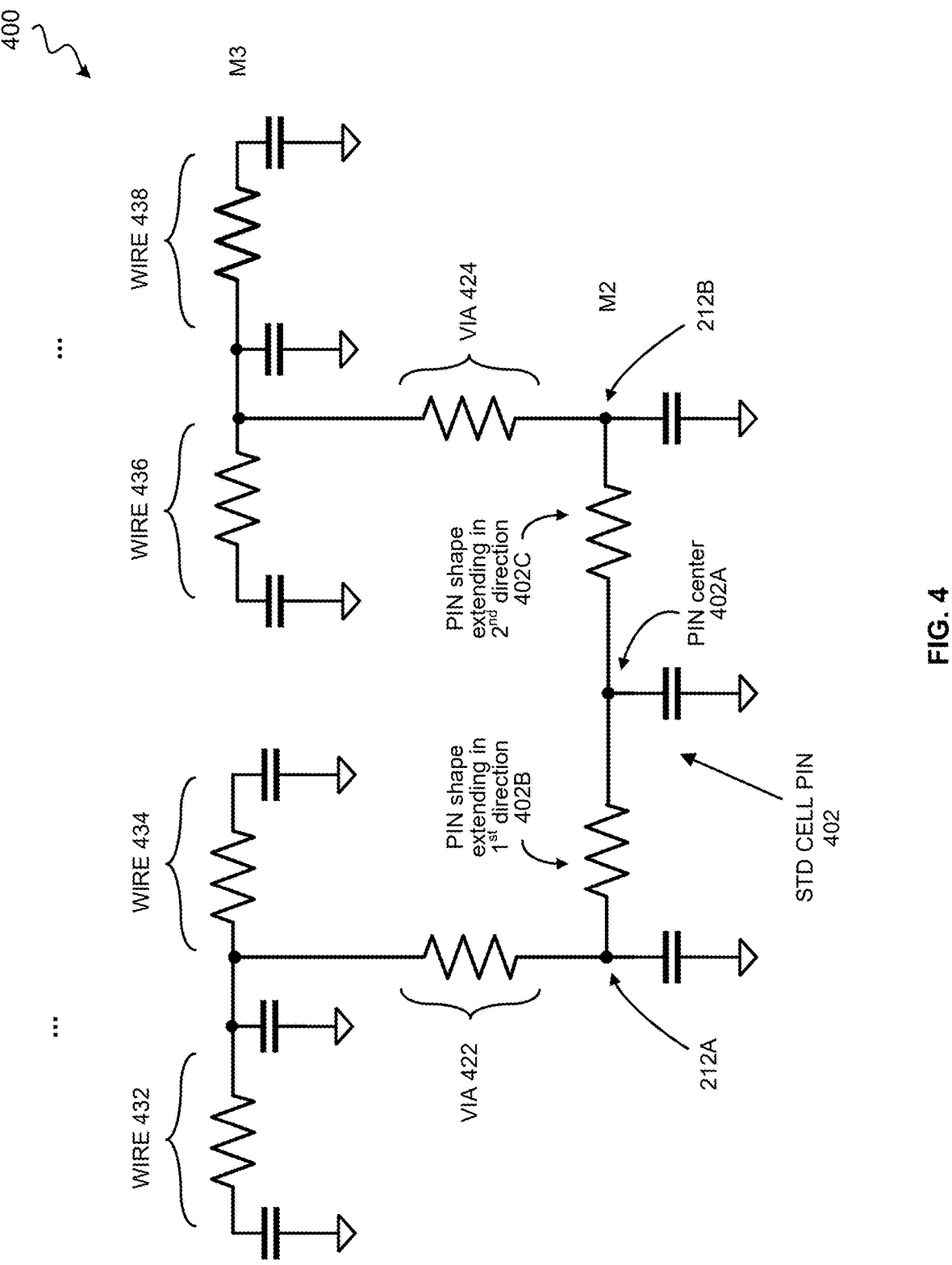
FIG. 4 illustrates an example of a resistance-capacitance (RC) network modeling a portion of an integrated circuit, according to certain aspects of the disclosure.

FIG. 4 illustrates a block diagram of an example RC network 400. RC network 400 can be used to model an integrated circuit layout by representing wire sections and vias as resistances, and connection points as capacitances. For example, RC network 400 shown in FIG. 4 can be a model of the interface portion of integrated circuit device 200 between standard cell 210 and via ladder 220 shown in FIG. 2. Referring to FIG. 4, RC network 400 may model the standard cell output pin (ZN) of standard cell 210 as standard cell pin 402 with a capacitance 402A as the pin center, and resistance 402B representing the pin shape extending in one direction and resistance 402C representing the pin shape extending in another direction on the M2 metal layer. The standard cell output pin (ZN) has two connection points 212A and 212B that connect to respective vias. The via connected to connection point 212A can be modeled as resistance 422, and the via connected to connection point 212B can be modeled as resistance 424. The wire segments of via ladder 220 on the M3 metal layer connected to the via of connection point 212A can be modeled as resistances 432 and 434. The wire segments of via ladder 220 on the M3 metal layer connected to the via of connection point 212B can be modeled as resistances 436 and 438. In some implementations, a power analysis tool can be invoked to model the integrated circuit layout as a RC network as part of the tool's function to estimate an integrated circuit's IR drops.

Figure 5:
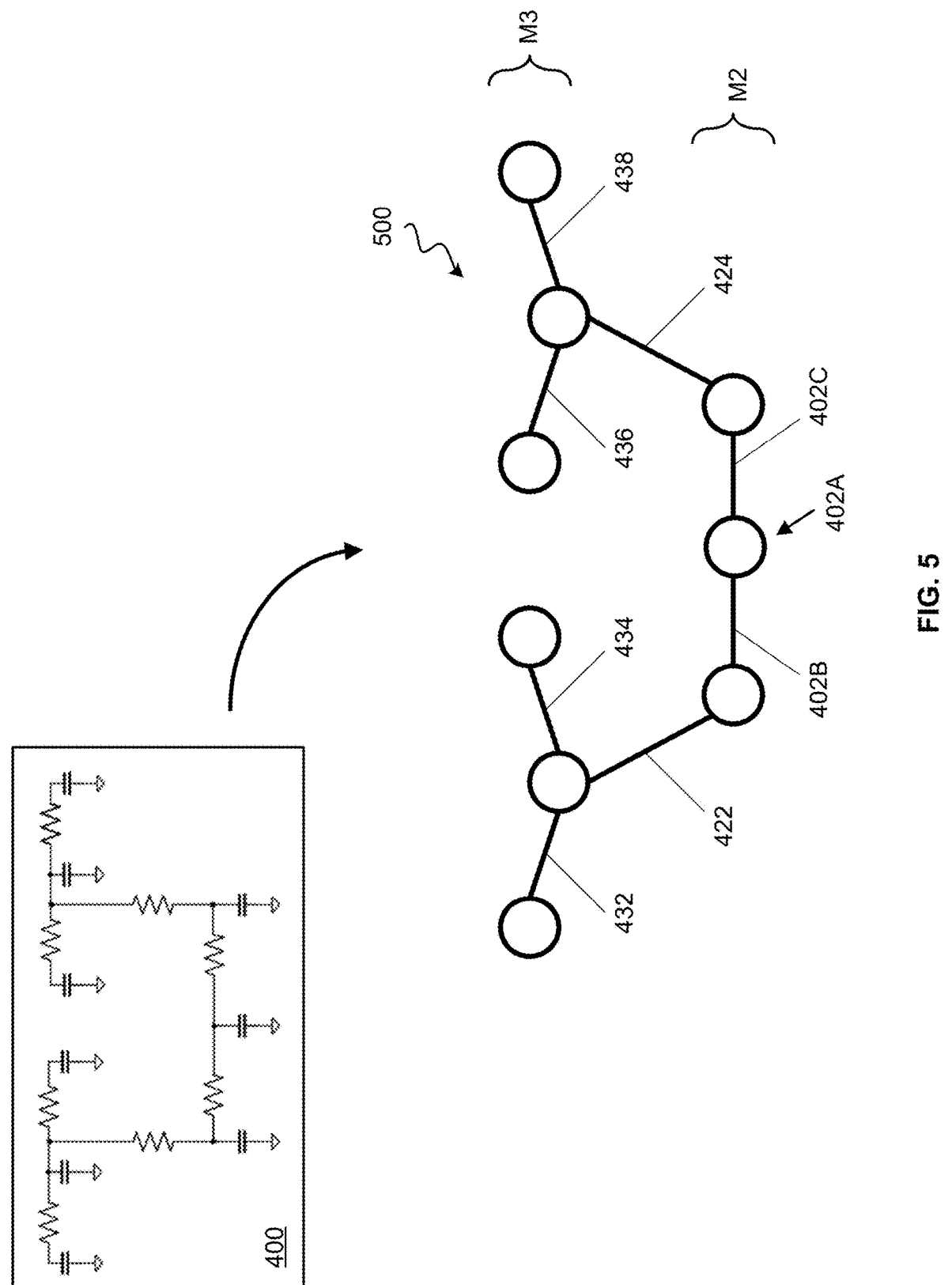
FIG. 5 illustrates an example of a tree data structure representing a RC network, according to certain aspects of the disclosure.

FIG. 5 illustrates a diagram of an example of a data structure 500 that can be used to represent a RC network. In the example shown, data structure 500 is a tree data structure representing the RC network 400 of FIG. 4. The capacitances of RC network 400 is represented as nodes, and the resistances are represented as edges connecting the nodes in the tree data structure. In some implementations, a power analysis tool modeling an integrated circuit layout as a RC network may store the RC network as data structure 500. The power analysis tool may use the data structure 500 to perform IR drop calculations. The techniques disclosed herein can leverage data structure 500 to perform via ladder checks even though data structure 500 is generated for power analysis purposes.

By way of example, to verify that the output pin (ZN) of standard cell 210 has two connections to the interface layer of via ladder 220, data structure 500 can be accessed to determine the number of connections in the integrated circuit layout. Data structure 500 can be queried to identify the node representing an instance of the standard cell output pin center. For example, the query can use the name of the standard cell pin listed in the standard cell dictionary provided to the via ladder checker, and identify a node (for example, by relying on the node's layer and coordinate) that corresponds to this pin of the standard cell. In the example shown, node 402A represents the pin center of output pin (ZN) of standard cell 210, and thus node 402A can be identified as a pin of interest. Using node 402A as a starting point or the root of the search, a breadth-first search can be performed to determine the connections to node 402A in data structure 500. The search can identify edges 402B and 402C as the pin shape extending from the pin center. The search can identify edge 422 as one connection made to edge 402B that goes up to the M3 metal layer, and edge 424 as the other connection made to edge 402C that goes up to the M3 metal layer. Thus, the pin of interest is determined to have two connected edges representing the two via connections to the via ladder 220. The number of connections determined from data structure 500 can be compared with the requisite number of connections indicted in the standard cell dictionary for this type of output pin to determine if there are a sufficient number of connections for this pin.

This process can be repeated for all standard cell pins that support connections to via ladders. In some implementations, analysis of the integrated circuit design can be partitioned to allow parallel processing. For instance, a map reduce process can be performed to split the via ladder check into multiple processes or execution threads that can be executed concurrently on respective processors. By way of example, each processor can perform concurrent searches on the data structure representing the RC network for different sets of standard cell pins to speed up the via ladder check.

FIG. 6 illustrates a flow diagram of an example of a process 600 for generating an integrated circuit design. Process 600 can be implemented as instructions or commands (e.g., software code, execution script, etc.) stored in a non-transitory computer-readable medium, which can be executed by a computing system to design and verify an integrated circuit device. In some implementations, some or all of process 600 can be implemented as part of one or more electronic design automation tools.

Process 600 may begin at block 602 by placing different types of standard cells in a circuit layout to implement an integrated circuit design. The standard cells can include various types of logic gates and can be part of a standard cell library provided, for example, by a semiconductor manufacturer or other technology node provider, or an IP block provider. In some implementations, the standard cells can be placed in the circuit layout according to a floorplan for a semiconductor chip such as a system-on-chip (SoC).

At block 604, a via ladder can be inserted for each of a selected set of standard cell pins of the standard cells in the circuit layout. The set of standard cell pins selected for via ladder insertion can be pins of standard cells with electro-migration risk or standard cells on a critical timing path. In some implementations, a dictionary or mapping table containing a list of standard cells and associated pins configured for connection to via ladders can be referenced to select the standard cell pins in the integrated circuit design. The dictionary or mapping table may contain a mapping of standard cell pins to compatible via ladder structures, and a compatible via ladder structure from the dictionary can be selected for insertion at the standard cell pin position. Selection of the via ladder structure may depend on the number of layers between the standard cell pin and the interconnect routing metal layer, the spacing available around the standard cell pin, timing requirements, electro-migration tolerance, or other design criteria. In some implementations, block 602 and/or block 604 can be performed by a place and route tool.

At block 606, a power analysis tool can be invoked to analyze the circuit layout. In some implementations, the power analysis tool may model the circuit layout as a resistance-capacitance (RC) network, and the RC network can be represented as a tree data structure. The tree data structure can represent the resistances of the RC network as edges in the tree data structure, and the capacitances of the RC network as nodes in the tree data structure. In some implementations, modeling the integrated circuit design as a tree data striture can be a native function of the power analysis tool, and thus the via ladder check can leverage this function of the power analysis tool without having to model the integrated circuit design separately.

At block 608, the tree data structure can be accessed to verify connectivity of each standard cell pin that needs to be connected to a corresponding via ladder in the circuit layout. For example, a via ladder checker (e.g., execution script, software module of an EDA tool, etc.) may access the tree data structure to perform the connectivity verification. In some implementations, the power analysis tool that generated the tree data structure may provide application programming interface (API) functions that can be used to access the tree data structure to query and search the tree data structure. Verifying the connectivity of a standard cell pin may include determining a requisite number of connections for connecting the standard pin to a compatible via ladder by looking up the standard cell pin in the dictionary or mapping table that maps compatible via ladders to standard cell pins. The tree data structure can then be searched (e.g., using breadth-first search from the standard cell pin) to determine the number of connections between the standard cell pin and the corresponding via ladder in the circuit layout. The number of connections between the standard cell pin and the corresponding via ladder determined from the tree data structure can be compared with the requisite number of connections in the mapping table.

At block 610, an error report can be generated to include one or more standard cell pins having an insufficient number of connections to the corresponding via ladder. For example, a standard cell pin that has less than the requisite number of connections as indicated in the dictionary or mapping table can be reported as a violation or error in the error report. In some implementations, the error report may include only discrepancies of the via ladder structure at the interface layer that interfaces with the standard cell pin, and exclude connectivity errors occurring in via ladder layers that do not interface with the standard cells. For example, the via ladder checker can target the verification by searching for only the standard cell pins listed in the standard cell dictionary that are compatible with via ladders, and the tree data structure search can stop when the breadth-first search has reached a leaf node (dead end) or has gone passed the layer above the interface layer. The errors reported can be limited to those occurring at the interface layer, because other verification tools (e.g., electromigration check and/or timing analysis) can be used to verify the upper via ladders. This can minimize the number of false-positive errors that would otherwise require further review, and speed up the physical design sign-off to reduce the design cycle time.

FIG. 7 illustrates a flow diagram of an example of a process 700 for verifying connectivity of a standard cell pin performed by a via ladder checker. Process 700 can be implemented as instructions or commands (e.g., software code, execution script, etc.) stored in a non-transitory computer-readable medium, which can be executed by a computing system to verify an integrated circuit device. In some implementations, some or all of process 700 can be implemented as part of one or more electronic design automation tools.

Process 700 may begin at block 702 by obtaining a mapping of standard cell pins to respective via ladder characteristics. The mapping can be included in a standard cell dictionary or a mapping table. The via ladder characteristics for the standard cell pin may contain a list of via ladder structures compatible with the standard cell pin. Each via ladder structure can be associated with layer information (e.g., which metal layers the via ladder spans) and connection information for each layer of the via ladder structure (e.g., requisite number of connection points for connecting one layer to another). In some implementations, the dictionary or mapping table may omit standard cell pins that do not connect to via ladders, or any other user-defined criteria.

At block 704, the sufficient number of connections for connecting a standard cell pin to a corresponding via ladder in the integrated circuit design can be determined based on the via ladder characteristics of the standard cell pin. For example, the name of the standard cell pin can be looked up or queried in the dictionary or mapping table to retrieve the via ladders' characteristics compatible with the standard cell pin (there may be more than one compatible via ladder structure per a standard cell pin). The via ladder characteristics may include a value indicating the requisite number of connections for connecting the standard cell pin to a via ladder.

At block 706, a data structure that models the integrated circuit design as a resistance-capacitance (RC) network can be accessed by the via ladder checker. In some implementations, the data structure can be in the form of a tree data structure in which capacitances are represented as nodes, and resistances are represented as edges between the nodes.

The data structure of the integrated circuit design can be generated, for example, by a power analysis tool as part of the native function of the tool. In other words, generation of the data structure presenting the RC network can be part of the normal processing flow of the power analysis tool when analyzing the IR drop of an integrated circuit device.

At block 708, the data structure is used to verify that the standard cell pin has the sufficient number of connections to at least one of the corresponding via ladders. Verification of the standard cell pin may include identifying the standard cell pin in the data structure, and traversing the data structure from the standard cell pin to determine the number of connections connecting the standard cell pin to the corresponding via ladder in the integrated circuit design. For example, traversing the data structure may include performing a breadth-first search from the standard cell pin when the data structure is a tree data structure.

When the determined number of connections for the standard cell pin in the data structure representation of the integrated circuit design is less than the sufficient number of connections, the standard cell pin can be added to an error report. The error report may include the instance of the standard cell pin, the type of standard cell, the location of the standard cell pin and the required via pillar structures for each violation. In some implementations, the error report can exclude insufficient connections occurring in layers of the via ladder above the interface layer that connects to the standard cell pin. Such errors can be omitted because the layers of the via ladder above the interface layer can be verified, for example, using electromigration checks and/or timing analysis simulations.

Process 700 can be repeated to check all standard cell pins that are connected to a via ladder in the integrated circuit design. To reduce runtime of the via ladder check, verification of the standard cell pins that are connected to respective via ladders can be partitioned for parallel execution (e.g., different processes or execution threads can verify a different set of standard cell pins). In some implementations, the integrated circuit design can be partitioned such that different processes or execution threads can verify a different area of the integration circuit design.

Figure 8:
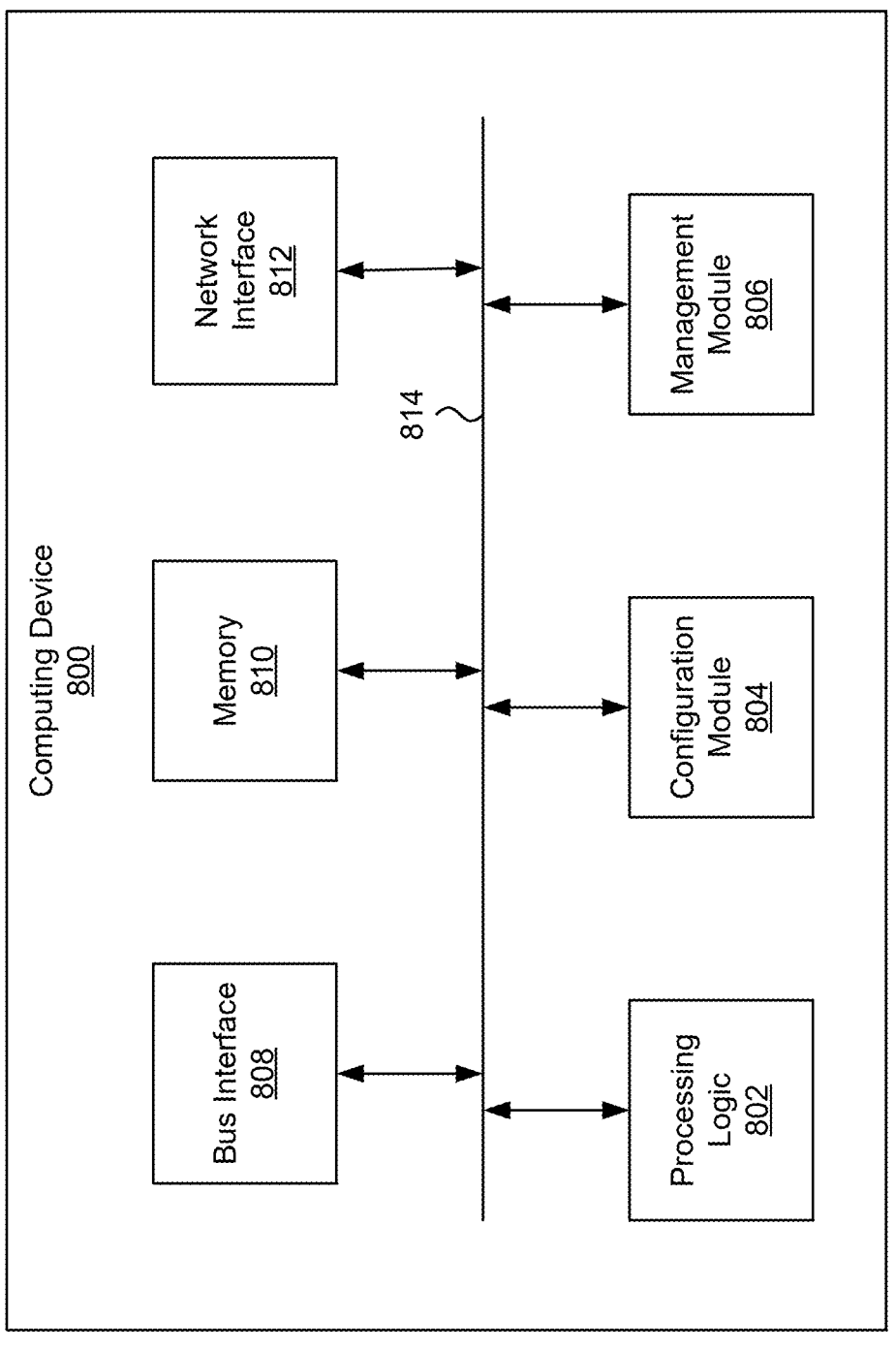
FIG. 8 illustrates an example of a computing device, according to certain aspects of the disclosure.

FIG. 8 illustrates an example of a computing device 800. Functionality and/or several components of the computing device 800 may be used without limitation with other embodiments disclosed elsewhere in this disclosure, without limitations. In some implementations, computing device 800 can execute a via ladder checker to verify an integrated circuit design. Computing device 800 can also invoke other electronic design automation tools such as a power analysis tool to facilitate the via ladder check. In some implementations, one or more integrated circuit components of computing device 800 can be designed and verified using the techniques disclosed herein.

In one example, the computing device 800 may include processing logic 802, a configuration module 804, a management module 806, a bus interface module 808, memory 810, and a network interface module 812. These modules may be hardware modules, software modules, or a combination of hardware and software. In certain instances, modules may be interchangeably used with components or engines, without deviating from the scope of the disclosure. The computing device 800 may include additional modules, not illustrated here. In some implementations, the computing device 800 may include fewer modules. In some implementations, one or more of the modules may be combined into one module. One or more of the modules may be in communication with each other over a communication channel 814. The communication channel 814 may include one or more busses, meshes, matrices, fabrics, a combination of these communication channels, or some other suitable communication channel.

The processing logic 802 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 802 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 802 may be stored on a computer-readable storage medium, for example, in the form of a computer program. The computer-readable storage medium may be non-transitory. In some cases, the computer-readable medium may be part of the memory 810.

The memory 810 may include either volatile or non-volatile, or both volatile and non-volatile types of memory. The memory 810 may, for example, include random access memory (RAM), read only memory (ROM), Electrically Erasable Programmable Read-Only Memory (EEPROM), flash memory, and/or some other suitable storage media. In some cases, some or all of the memory 810 may be internal to the computing device 800, while in other cases some or all of the memory may be external to the computing device 800. The memory 810 may store an operating system comprising executable instructions that, when executed by the processing logic 802, provides the execution environment for executing instructions providing networking functionality for the computing device 800. The memory may also store and maintain several data structures and routing tables for facilitating the functionality of the computing device 800.

In some implementations, the configuration module 804 may include one or more configuration registers. Configuration registers may control the operations of the computing device 800. In some implementations, one or more bits in the configuration register can represent certain capabilities of the computing device 800. Configuration registers may be programmed by instructions executing in the processing logic 802, and/or by an external entity, such as a host device, an operating system executing on a host device, and/or a remote device. The configuration module 804 may further include hardware and/or software that control the operations of the computing device 800.

In some implementations, the management module 806 may be configured to manage different components of the computing device 800. In some cases, the management module 806 may configure one or more bits in one or more configuration registers at power up, to enable or disable certain capabilities of the computing device 800. In certain implementations, the management module 806 may use processing resources from the processing logic 802. In other implementations, the management module 806 may have processing logic similar to the processing logic 802, but segmented away or implemented on a different power plane than the processing logic 802.

The bus interface module 808 may enable communication with external entities, such as a host device and/or other components in a computing system, over an external communication medium. The bus interface module 808 may include a physical interface for connecting to a cable, socket, port, or other connection to the external communication medium. The bus interface module 808 may further include hardware and/or software to manage incoming and outgoing transactions. The bus interface module 808 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 808 may include the physical layer for any of these bus protocols, including a connector, power management, and error handling, among other things. In some implementations, the computing device 800 may include multiple bus interface modules for communicating with multiple external entities. These multiple bus interface modules may implement the same local bus protocol, different local bus protocols, or a combination of the same and different bus protocols.

The network interface module 812 may include hardware and/or software for communicating with a network. This network interface module 812 may, for example, include physical connectors or physical ports for wired connection to a network, and/or antennas for wireless communication to a network. The network interface module 812 may further include hardware and/or software configured to implement a network protocol stack. The network interface module 812 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 800 may include multiple network interface modules, each configured to communicate with a different network. For example, in these implementations, the computing device 800 may include a network interface module for communicating with a wired Ethernet network, a wireless 802.11 network, a cellular network, an Infiniband network, etc.

The various components and modules of the computing device 800, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 8, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer-implemented method, comprising:
implementing an integrated circuit design by placing different types of standard cells in a circuit layout;
inserting a via ladder for each of a selected set of standard cell pins of the standard cells in the circuit layout;
invoking a power analysis tool to analyze the circuit layout, the power analysis tool modeling the circuit layout as a resistance-capacitance network represented as a tree data structure;
accessing the tree data structure to verify connectivity of each standard cell pin that needs to be connected to a corresponding via ladder at an interface layer of the corresponding via ladder in the circuit layout by:
determining a requisite number of connections for connecting the standard cell pin to a compatible via ladder by looking up the standard cell pin in a mapping table that maps compatible via ladders to standard cell pins;
searching the tree data structure to determine a number of connections between the standard cell pin and the corresponding via ladder in the circuit layout; and
comparing the number of connections between the standard cell pin and the corresponding via ladder determined from the tree data structure to the requisite number of connections in the mapping table; and
generating an error report that includes one or more standard cell pins having an insufficient number of connections to the corresponding via ladder.

2. The computer-implemented method of claim 1, wherein searching the tree data structure includes performing a breadth-first search on the tree data structure from the standard cell pin.

3. The computer-implemented method of claim 2, wherein via ladder layers that do not interface with the standard cells are excluded from the breadth-first search, and the error report excludes connectivity errors occurring in those via ladder layers.

4. The computer-implemented method of claim 1, wherein verifying the connectivity of each standard cell pin of the integrated circuit design includes partitioning the integrated circuit design for parallel processing on multiple processors.

5. A method comprising:
obtaining a mapping of standard cell pins to respective via ladder characteristics;
determining a sufficient number of connections for connecting a standard cell pin to a corresponding via ladder in an integrated circuit design based on the via ladder characteristics of the standard cell pin;
accessing a data structure that models the integrated circuit design as a resistance-capacitance network;
using the data structure to verify whether the standard cell pin has the sufficient number of connections to the corresponding via ladder by:
identifying the standard cell pin in the data structure; and
traversing the data structure from the standard cell pin to determine a number of connections connecting the standard cell pin to the corresponding via ladder in the integrated circuit design; and
adding the standard cell pin to an error report when the determined number of connections for the standard cell pin in the data structure representing the integrated circuit design is less than the sufficient number of connections.

6. The method of claim 5, wherein the data structure is a tree data structure.

7. The method of claim 6, wherein traversing the tree data structure includes performing a breadth-first search on the tree data structure from the standard cell pin.

8. The method of claim 5, wherein the error report excludes insufficient connections occurring in layers of the via ladder above an interface layer that connects to the standard cell pin.

9. The method of claim 8, wherein the layers of the via ladder above the interface layer are verified using electro-migration check or timing analysis simulations.

10. The method of claim 5, wherein the data structure modeling the integrated circuit design as a resistance-capacitance network is generated by a power analysis tool.

11. The method of claim 5, wherein the via ladder characteristics for the standard cell pin include a list of via ladder structures compatible with the standard cell pin.

12. The method of claim 11, wherein each via ladder structure is associated with layer information and connection information for each layer of the via ladder structure.

13. The method of claim 5, further comprising partitioning, for parallel execution, verification of all standard cell pins in the integrated circuit design which are connected to respective via ladders.

14. The method of claim 5, wherein the corresponding via ladder for the standard cell pin is inserted into the integrated circuit design based on a number of layers between the standard cell pin and an interconnect routing metal layer.

15. The method of claim 5, wherein the via ladder for the corresponding standard cell pin has been modified in the integrated circuit design to address a design violation of another component.

16. The method of claim 15, wherein the modification includes removing a portion of the via ladder.

17. The method of claim 15, wherein the modification includes repositioning a portion of the via ladder.

18. A non-transitory computer-readable medium storing code which, when executed by one or more processors, causes the one or more processors to perform operations including:
obtaining a mapping of standard cell pins to respective via ladder characteristics;
determining a sufficient number of connections for connecting a standard cell pin to a corresponding via ladder in an integrated circuit design based on the via ladder characteristics of the standard cell pin;
accessing a data structure that models the integrated circuit design as a resistance-capacitance network;
using the data structure to verify whether the standard cell pin has the sufficient number of connections to the corresponding via ladder by:
identifying the standard cell pin in the data structure; and
traversing the data structure from the standard cell pin to determine a number of connections connecting the standard cell pin to the corresponding via ladder in the integrated circuit design; and
adding the standard cell pin to an error report when the determined number of connections for the standard cell pin in the data structure representing the integrated circuit design is less than the sufficient number of connections.

19. The non-transitory computer-readable medium of claim 18, wherein the error report excludes insufficient connections occurring in layers of the via ladder above an interface layer that connects to the standard cell pin.

20. The non-transitory computer-readable medium of claim 19, wherein the layers of the via ladder above the interface layer are verified separately from the interface layer.

\* \* \* \* \*